(12) United States Patent
Jeong et al.

(10) Patent No.: US 11,880,599 B2
(45) Date of Patent: Jan. 23, 2024

(54) MEMORY SYSTEM AND OPERATING METHOD OF THE MEMORY SYSTEM INPUTTING AN ADDITIONAL READ ENABLE TOGGLE SIGNAL TO OUTPUT STATUS INFORMATION OF MEMORY DEVICE

(71) Applicant: SK hynix Inc., Icheon (KR)

(72) Inventors: Jae Hyeong Jeong, Icheon (KR); Dae Sung Kim, Icheon (KR); Sung Ho Ahn, Icheon (KR)

(73) Assignee: SK hynix Inc., Icheon (KR)

( * ) Notice: Subject to any disclaimer, the term of this patent is extended or adjusted under 35 U.S.C. 154(b) by 44 days.

(21) Appl. No.: 17/411,824

(22) Filed: Aug. 25, 2021

(65) Prior Publication Data

US 2022/0334767 A1 Oct. 20, 2022

(30) Foreign Application Priority Data

Apr. 15, 2021 (KR) .......................... 10-2021-0048975

(51) Int. Cl.
*G06F 3/06* (2006.01)

(52) U.S. Cl.
CPC .......... *G06F 3/0659* (2013.01); *G06F 3/0604* (2013.01); *G06F 3/0673* (2013.01)

(58) Field of Classification Search
CPC ..... G06F 3/0659; G06F 3/0604; G06F 3/0673
See application file for complete search history.

(56) References Cited

U.S. PATENT DOCUMENTS

| 11,217,285 | B1* | 1/2022 | Jeter | .................... G06F 13/1689 |
| 2021/0208815 | A1* | 7/2021 | Park | ...................... G06F 3/0659 |
| 2022/0057967 | A1* | 2/2022 | Kim | .................... G06F 13/1684 |
| 2022/0083264 | A1* | 3/2022 | Kojima | ................. G06F 3/0679 |
| 2022/0101895 | A1* | 3/2022 | Jo | ........................ G11C 7/1048 |

FOREIGN PATENT DOCUMENTS

| KR | 1020180029432 A | 3/2018 |
| KR | 1020190044349 A | 4/2019 |

* cited by examiner

*Primary Examiner* — Charles Rones
*Assistant Examiner* — Alexander Vinnitsky

(57) ABSTRACT

A memory system includes a memory device and a memory controller. The memory controller transmits a data read command to the memory device, inputs N read enable toggle signals to the memory device in order for the memory device to output the data requested by the data read command requests, and inputs an additional read enable toggle signal to the memory device. The memory device outputs status information of the memory device to the memory controller in response to the additional read enable toggle signal.

17 Claims, 16 Drawing Sheets

MEMORY SYSTEM AND OPERATING METHOD OF THE MEMORY SYSTEM INPUTTING AN ADDITIONAL READ ENABLE TOGGLE SIGNAL TO OUTPUT STATUS INFORMATION OF MEMORY DEVICE

CROSS-REFERENCE TO RELATED APPLICATION

The present application claims priority under 35 U.S.C. 119(a) to Korean patent application number 10-2021-0048975 filed on Apr. 15, 2021, which is incorporated herein by reference in its entirety.

TECHNICAL FIELD

The embodiments relate to a memory system and an operating method of the memory system.

BACKGROUND

A memory system includes a memory device that stores data on the basis of a request from a host, such as a computer, servers, a smartphone, a tablet PC, or other electronic devices. Examples of the memory system span from a traditional magnetic-disk-based hard disk drive (HDD) to a semiconductor-based data storage device such as a solid state drive (SSD), a universal flash storage device (UFS), an embedded MMC (eMMC) device, or the like.

The memory system may further include a memory controller for controlling the memory device. The memory controller may receive a command from the host and execute the command or control read/write/erase operations on the memory device in the memory system. The memory controller may be used to execute firmware to perform a logical operation for controlling such operations.

When reading data stored in the memory device, the memory controller additionally transmits a status read command to the memory device in order to check a status of the memory device after the memory device outputs the data.

SUMMARY

Embodiments of the present disclosure may provide a memory system and an operating method of the memory system, capable of reducing a time required to check a status of a memory device in the memory system after a read operation is performed on the memory device.

In one aspect, embodiments of the present disclosure may provide a memory system including a memory device configured to store data, and a memory controller configured to communicate with the memory device and control the memory device.

The memory controller may transmit a data read command to the memory device in order to read data stored in the memory device.

The memory controller may input N read enable toggle signals (N is a natural number) to the memory device in order for the memory device to output the data requested by the data read command.

The memory controller may input an additional read enable toggle signal to the memory device after inputting the N read enable toggle signals to the memory device.

The memory device may be configured to output status information of the memory device to the memory controller in response to the additional read enable toggle signal.

Meanwhile, the memory device may include a data register storing the data requested by the data read command and a status register storing the status information of the memory device. After receiving the N read enable toggle signals, the memory device may switch an activated register for outputting data to the memory controller from the data register to the status register.

In another aspect, embodiments of the disclosure may provide an operating method of a memory system including a memory device to store data and a memory controller to control the memory device.

The operating method of the memory system may include transmitting, by the memory controller, a data read command to the memory device in order to read data stored in the memory device.

The operating method of the memory system may include inputting, by the memory controller, N read enable toggle signals (N is a natural number) to the memory device in order for the memory device to output the data requested by the data read command.

The operating method of the memory system may include inputting, by the memory controller, an additional read enable toggle signal to the memory device after inputting the N read enable toggle signals to the memory device.

The operating method of the memory system may include outputting, by the memory device, status information of the memory device to the memory controller in response to the additional read enable toggle signal.

The memory device may include a data register storing the data requested by the data read command and a status register storing the status information of the memory device.

Meanwhile, after the N read enable toggle signals are inputted to the memory device, an activated register for outputting data to the memory controller may be switched from the data register to the.

In another aspect, embodiments of the disclosure may provide a memory device including a data register storing the data requested by the data read command, a status register storing the status information of the memory device and a control logic controlling operation of the memory device.

The control logic may receive a data read command from a memory controller in order to read data stored in the memory device.

The control logic may receive N read enable toggle signals (N is a natural number) from the memory controller to output the data requested by the data read command.

The control logic may receive an additional read enable toggle signal from the memory controller after receiving the N read enable toggle signals from the memory controller.

The control logic may output status information of the memory device to the memory controller in response to the additional read enable toggle signal.

The control logic may switch an activated register for outputting data to the memory controller from the data register to the status register after receiving the N read enable toggle signals.

According to embodiments of the present disclosure, it is possible to reduce the time required to check the status of the memory device after the read operation is performed.

DETAILED DESCRIPTION

Figure 1:
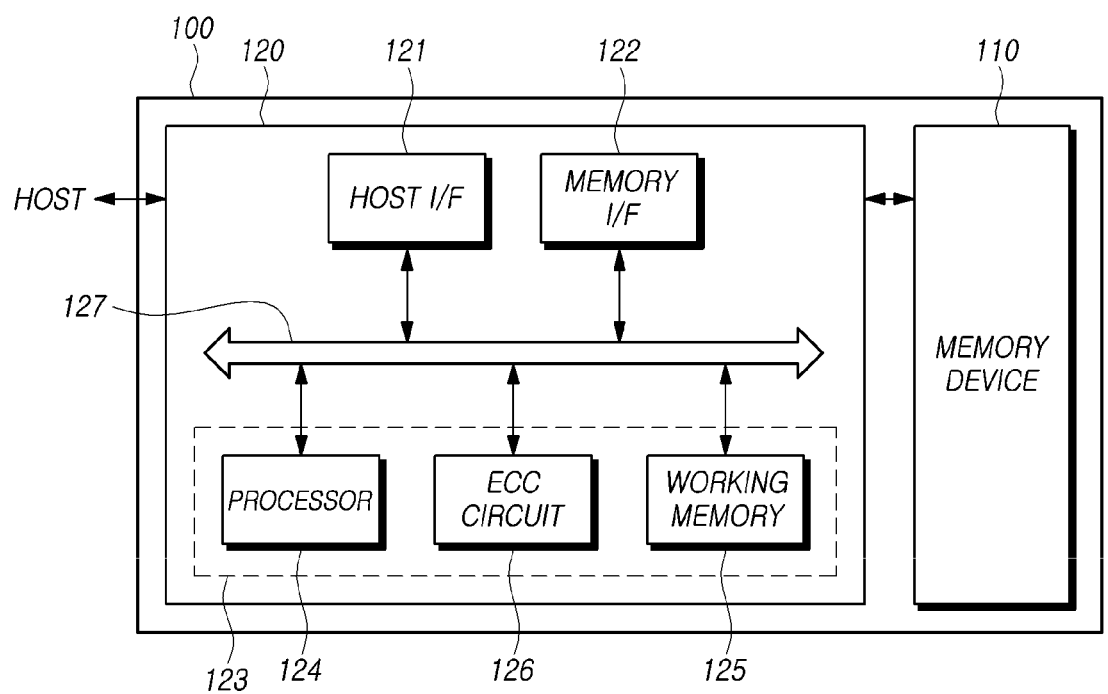
FIG. 1 is a schematic diagram illustrating a configuration of a memory system based on an embodiment of the disclosed technology.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented in at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

FIG. 1 is a diagram illustrating the schematic configuration of a memory system 100 based on an embodiment of the disclosed technology.

In some implementations, the memory system 100 may include a memory device 110 configured to store data, and a memory controller 120 configured to control the memory device 110.

The memory device 110 may include multiple memory blocks each including a plurality of memory cells for storing data. The memory device 110 may be configured to operate in response to control signals received from the memory controller 120. Operations of the memory device 110 may include, for example, a read operation, a program operation (also referred to as a "write operation"), an erasure operation, and the like.

The memory cells in the memory device 110 are used to store data and may be arranged in a memory cell array. The memory cell array may be divided into memory blocks of memory cells and each block includes different pages of memory cells. In typical implementations of NAND flash memory devices, a page of memory cells is the smallest memory unit that can be programmed or written, and the data stored in memory cells can be erased at the block level.

In some implementations, the memory device 110 may be implemented as various types, such as a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Some embodiments of the disclosed technology are applicable to any type of flash memory devices having an electric charge storage layer. In an implementation, the electric charge storage layer may be formed of a conductive material, and such an electric charge storage layer can be called a floating gate. In another implementation, the electric charge storage layer may be formed of an insulating material, and such a flash memory device can be called a charge trap flash (CTF).

The memory device 110 may be configured to receive a command and an address from the memory controller 120 to access an area of the memory cell array selected using the address. That is, the memory device 110 may perform an operation corresponding to the received command on a memory area of the memory device having a physical address corresponding to the received address from the memory controller 120.

In some implementations, the memory device 110 may perform a program operation, a read operation, an erasure operation, and the like. During the program operation, the memory device 110 may write data in the area selected by the address. During the read operation, the memory device 110 may read data from a memory area selected by the address. During the erasure operation, the memory device 110 may erase data stored in a memory area selected by the address.

The memory controller 120 may control write (program), read, erasure, and background operations that are performed on the memory device 110. The background operation may include, for example, operations that are implemented to optimize the overall performance of the memory device 110, such as a garbage collection (GC) operation, a wear leveling (WL) operation, and a bad block management (BBM) operation.

The memory controller 120 may control the operation of the memory device 110 at the request of a host. Alternatively, the memory controller 120 may control the operation of the memory device 110 even in absence of request from the host when it performs such background operations of the memory device.

The memory controller 120 and the host may be separate devices. In some implementations, the memory controller 120 and the host may be integrated and implemented as a single device. In the following description, the memory controller 120 and the host will be discussed as separate devices as an example.

Referring to FIG. 1, the memory controller 120 may include a memory interface 122, a control circuit 123, and a host interface 121.

The host interface 121 may be configured to provide an interface for communication with the host.

When receiving a command from the host HOST, the control circuit 123 may receive the command through the host interface 121 and may perform an operation of processing the received command.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform memory operations on the memory device 110 based on control signals and instructions from the control circuit 123.

The control circuit 123 may be configured to control the operation of the memory device 110 through the memory controller 120. For example, the control circuit 123 may include a processor 124 and a working memory 125. The control circuit 123 may further include an error detection/correction circuit (ECC circuit) 126 and the like.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may be used to perform operations associated with a flash translation layer (FTL) to effectively manage the memory operations on the memory system 100. The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, based on the mapping unit. Typical address mapping methods may include a page mapping method, a block mapping method, and a hybrid mapping method.

The processor 124 may be configured to randomize data received from the host to write the randomized data to the memory cell array. For example, the processor 124 may randomize data received from the host by using a randomizing seed. The randomized data is provided to the memory device 110 and written to the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. In other words, the processor 124 may control the overall operation of the memory controller 120 and, in order to perform a logical operation, may execute (drive) firmware loaded into the working memory 125 during booting.

The firmware refers to a program or software stored on a certain nonvolatile memory and is executed inside the memory system 100.

In some implementations, the firmware may include various functional layers. For example, the firmware may include at least one of a flash translation layer (FTL) configured to translate a logical address in the host HOST requests to a physical address of the memory device 110, a host interface layer (HIL) configured to interpret a command that the host HOST issues to a data storage device such as the memory system 100 and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, at least one among a static RAM (SRAM), a dynamic RAM (DRAM), and a synchronous RAM (SDRAM) as a volatile memory.

The error detection/correction circuit 126 may be configured to detect and correct one or more erroneous bits in the data by using an error detection and correction code. In some implementations, the data that is subject to the error detection and correction may include data stored in the working memory 125, and data retrieved from the memory device 110.

The error detection/correction circuit 126 may be implemented to decode data by using the error correction code. The error detection/correction circuit 126 may be implemented by using various decoding schemes. For example, a decoder that performs nonsystematic code decoding or a decoder that performs systematic code decoding may be used.

In some implementations, the error detection/correction circuit 126 may detect one or more erroneous bits on a sector basis. That is, each piece of read data may include multiple sectors. In this patent document, a sector may refer to a data unit that is smaller than the read unit (e.g., page) of a flash memory. Sectors constituting each piece of read data may be mapped based on addresses.

In some implementations, the error detection/correction circuit 126 may calculate a bit error rate (BER) and determine whether the number of erroneous bits in the data is within the error correction capability sector by sector. For example, if the BER is higher than a reference value, the error detection/correction circuit 126 may determine that the erroneous bits in the corresponding sector are uncorrectable and the corresponding sector is marked "fail." If the BER is lower than or equals to the reference value, the error detection/correction circuit 126 may determine that the corresponding sector is correctable or the corresponding sector can be marked "pass."

The error detection/correction circuit 126 may perform error detection and correction operations successively on all read data. When a sector included in the read data is correctable, the error detection/correction circuit 126 may move on to the next sector to check as to whether an error correction operation is needed on the next sector. Upon completion of the error detection and correction operations on all the read data in this manner, the error detection/correction circuit 126 may acquire information as to which sector is deemed uncorrectable in the read data. The error detection/correction circuit 126 may provide such information (e.g., address of uncorrectable bits) to the processor 124.

The memory system 100 may also include a bus 127 to provide a channel between the constituent elements 121, 122, 124, 125, and 126 of the memory controller 120. The bus 127 may include, for example, a control bus for delivering various types of control signals and commands, and a data bus for delivering various types of data.

By way of example, FIG. 1 illustrates the above-mentioned constituent elements 121, 122, 124, 125, and 126 of the memory controller 120. It is noted that some of those illustrated in the drawings may be omitted, or some of the above-mentioned constituent elements 121, 122, 124, 125, and 126 of the memory controller 120 may be integrated into a single element. In addition, in some implementations, one or more other constituent elements may be added to the above-mentioned constituent elements of the memory controller 120.

Figure 2:
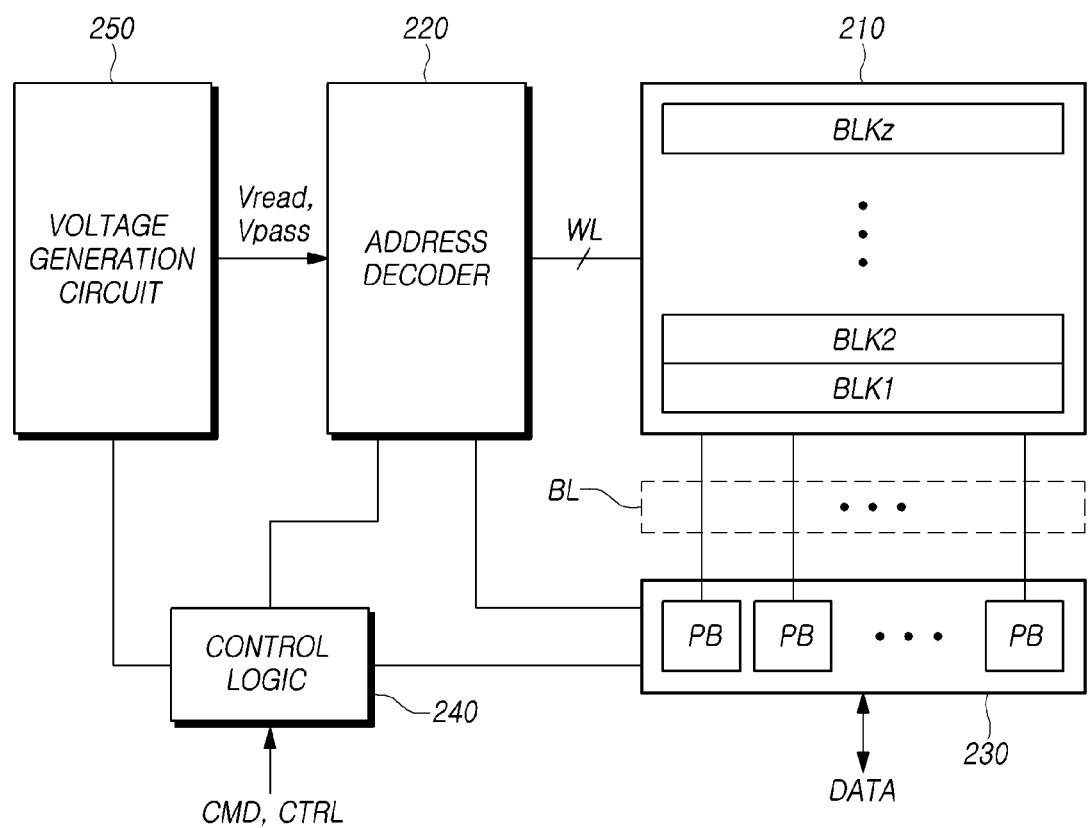
FIG. 2 is a block diagram schematically illustrating a memory device based on an embodiment of the disclosed technology.

FIG. 2 is a block diagram schematically illustrating a memory device 110 based on an embodiment of the disclosed technology.

In some implementations, the memory device 110 based on an embodiment of the disclosed technology may include a memory cell array 210, an address decoder 220, a read/write circuit 230, a control logic 240, and a voltage generation circuit 250.

The memory cell array 210 may include multiple memory blocks BLK1-BLKz, where z is a natural number equal to or larger than 2.

In the multiple memory blocks BLK1-BLKz, multiple word lines WL and multiple bit lines BL may be disposed in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells may be arranged in a vertical channel structure.

The memory cell array 210 may be configured as a memory cell array having a two-dimensional structure. In some implementations, the memory cell array 210 may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data per memory cell. As another example, each of the multiple memory cells included in the memory cell array 210 may be a triple-level cell (TLC) configured to store three bits of data per memory cell. As another example, each of the multiple memory cells included in the memory cell array 210 may be a quad-level cell (QLC) configured to store four bits of data per memory cell. As another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to command and control signals of the control logic 240.

The address decoder 220 may receive addresses through an input/output buffer inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may, during a read operation, apply the read voltage Vread to a selected word line WL inside a selected memory block and apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit lines BL connected to the memory cells to detect, at a sensing node, a change proportional to the amount of current that varies depending on the program state of a corresponding memory cell, and may hold or latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

A memory block BLK included in the memory device 110 may include multiple pages PG. In some implementations, a plurality of memory cells arranged in columns form memory cell strings, and a plurality of memory cells arranged in rows form memory blocks. Each of the multiple pages PG is coupled to one of word lines WL, and each of the memory cell strings STR is coupled to one of bit lines BL.

In the memory block BLK, multiple word lines WL and multiple bit lines BL may be arranged in rows and columns. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

In some implementations, the multiple word lines WL and the multiple bit lines BL may intersect with each other, thereby addressing a single memory cell in the array of multiple memory cells MC. In some implementations, each memory cell MC may include a transistor TR that includes a material layer that can hold an electrical charge.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some implementations, at least one dummy word line may be additionally arranged between the first outermost word line and the first selection line. In addition, at least one dummy word line may be additionally arranged between the second outermost word line and the second selection line.

A read operation and a program operation (or write operation) of the memory block may be performed page by page, and an erasure operation may be performed memory block by memory block.

Figure 3:
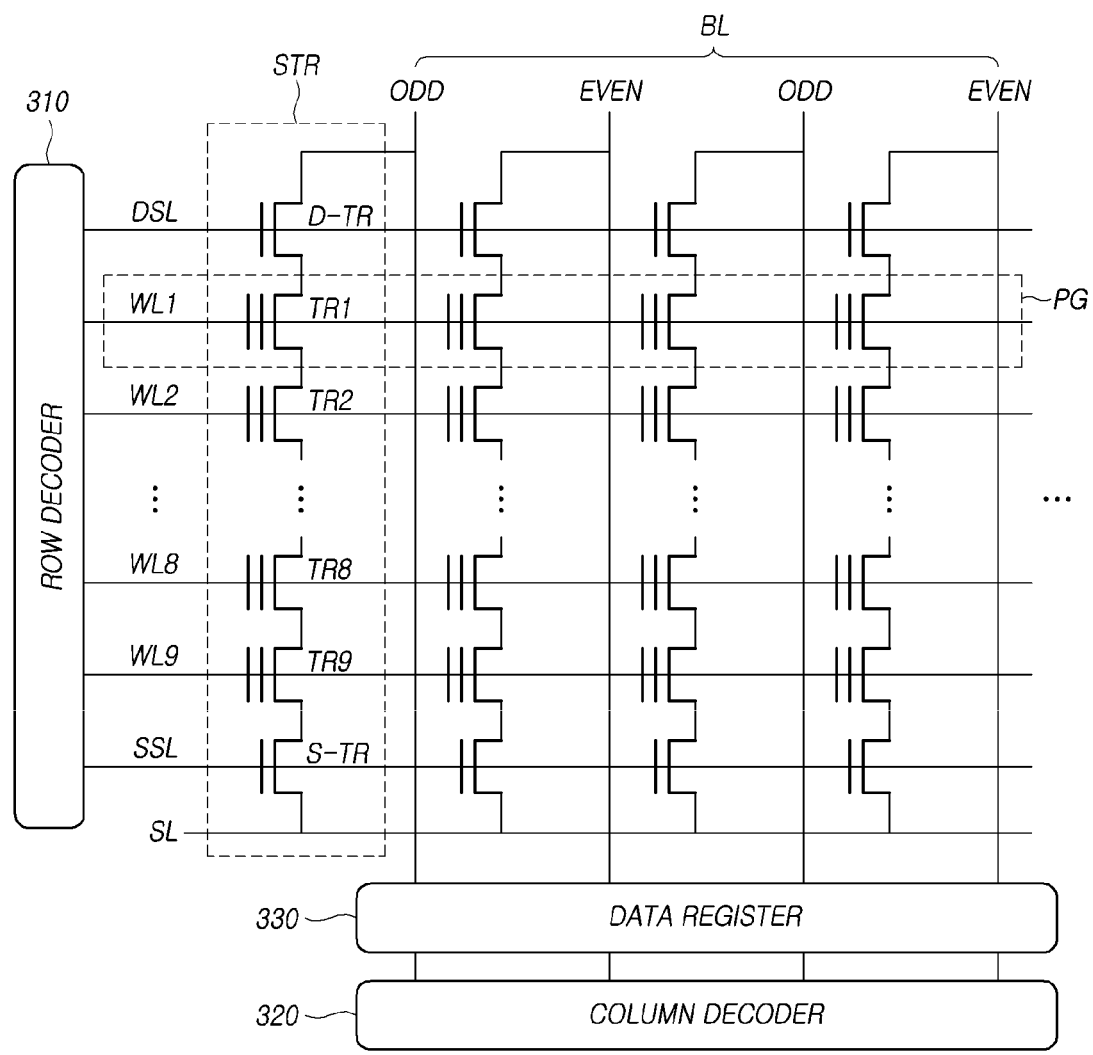
FIG. 3 illustrates a structure of word lines and bit lines of a memory device based on an embodiment of the disclosed technology.

FIG. 3 is a diagram illustrating a structure of word lines WL and bit lines BL of a memory device 110 based on an embodiment of the disclosed technology.

Referring to FIG. 3, the memory device 110 has a core area in which memory cells MC are arranged, and an auxiliary area (the remaining area other than the core area) to include circuitry that is used to perform the operations of the memory cell array 210.

In the core area, a certain number of memory cells arranged in one direction can be called "page" PG, and a certain number of memory cells that are coupled in series can be called "memory cell string" STR.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (e.g., two or four) pages PG. Each page PG is the smallest unit in a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines BL and even-numbered bit lines BL such that a pair of odd-numbered bit line and even-numbered bit line is coupled in common to a column decoder 320.

In accessing a memory cell MC, the row decoder 310 and the column decoder 320 are used to locate a desired memory cell based on the address.

In some implementations, the data register 330 plays an important role because all data processing by the memory device 110, including program and read operations, occurs via the data register 330. If data processing by the data register 330 is delayed, all of the other areas need to wait until the data register 330 finishes the data processing, degrading the overall performance of the memory device 110.

Referring to the example illustrated in FIG. 3, in one memory cell string STR, multiple transistors TR1-TR9 may be connected to multiple word lines WL1-WL9, respectively. In some implementations, the multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding memory cell string STR to the data register 330. The second selection transistor S-TR is used as a switch that connects the corresponding memory cell string STR to the source line SL. That is, the first selection transistor D-TR and the second selection transistor S-TR can be used to enable or disable the corresponding memory cell string STR.

In some implementations, the memory system 100 applies a predetermined turn-on voltage Vcc to the gate electrode of the first selection transistor D-TR, thereby turning on the first selection transistor D-TR, and applies a predetermined turn-off voltage (e.g., 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding memory cell string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may apply a predetermined voltage (e.g., +20V) to the substrate through a source line SL during an erasure operation. The memory system 100 applies a certain voltage to allow both the first selection transistor D-TR and the second selection transistor S-TR to float during an erasure operation. As a result, the applied erasure voltage can remove electrical charges from the floating gates FG of the selected memory cells.

Figure 4:
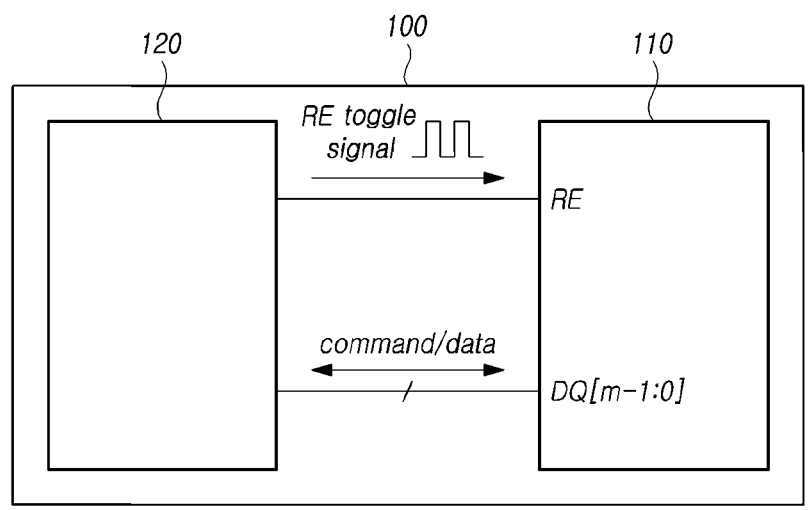
FIG. 4 illustrates a memory system according to an embodiment of the present disclosure.

FIG. 4 illustrates a memory system 100 according to an embodiment of the present disclosure.

Referring to FIG. 4, the memory system 100 may include a memory device 110 capable of storing data and a memory controller 120 that communicates with the memory device 110 and controls the memory device 110.

The memory device 110 of the memory system 100 receives data and/or commands from the memory controller 120 or outputs data through m data input/output terminals DQ[m-1:0] (m is a natural number of 2 or more). The data input/output terminal DQ is a bidirectional terminal capable of inputting or outputting data. However, the data inputting and outputting cannot be simultaneously executed through the data input/output terminal DQ.

In addition, the memory device 110 may receive a read enable (RE) toggle signal from the memory controller 120 through a read enable terminal RE.

The read enable terminal RE is a terminal used to receive a signal, which instructs the memory device 110 to output data, from the memory controller 120.

The read enable toggle signal is a signal that the memory controller 120 inputs to the memory device 110 so that the memory device 110 outputs data through the data input/output terminal DQ. Whenever the read enable toggle signal is input thereto, the memory device 110 may output data having a preset input/output size (e.g., m bits) through the data input/output terminal DQ (e.g., DQ[m-1:0]).

Hereinafter, it will be described operations performed by the memory device 110 and the memory controller 120 in a process of reading data with reference to FIGS. 5 to 7.

Figure 5:
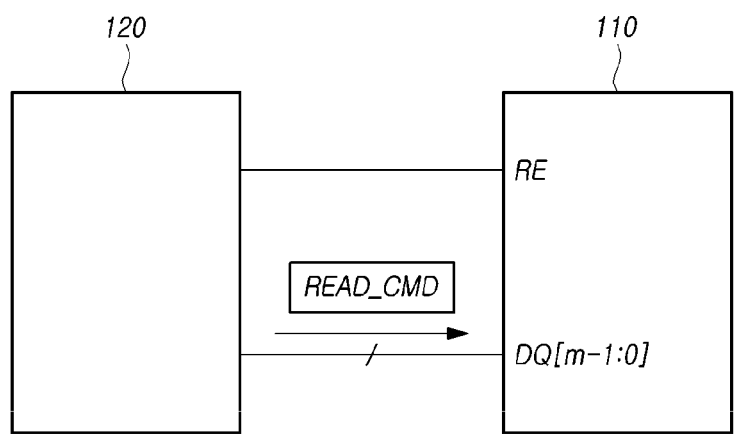
FIG. 5 illustrates an operation of transmitting a data read command to a memory device by a memory controller according to an embodiment of the present disclosure.
Figure 6:
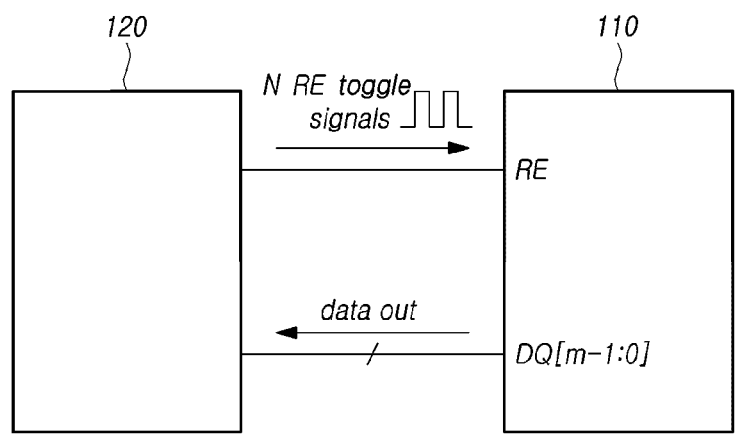
FIG. 6 illustrates an operation of outputting data by a memory device after the operation described in FIG. 5 is executed.
Figure 6:
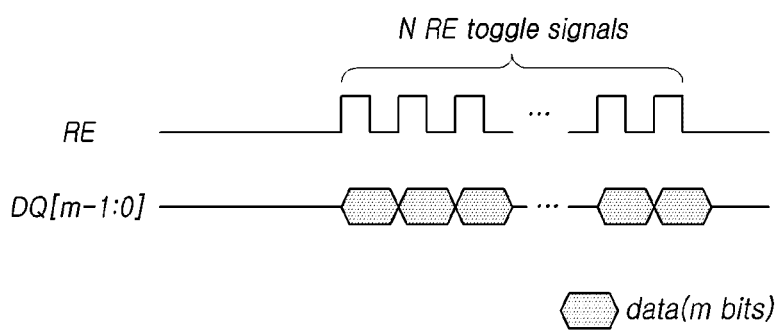
Figure 7:
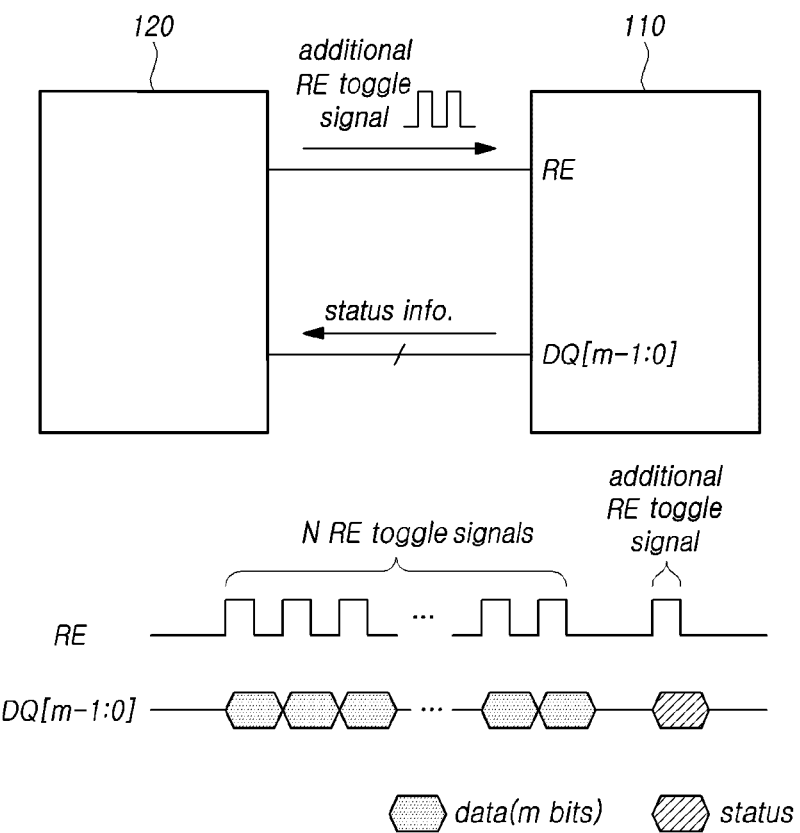
FIG. 7 illustrates an operation in which the memory device outputs status information after the operation described in FIG. 6 is executed.

FIGS. 5 to 7 illustrate an operation of reading data by the memory system 100 of FIG. 4 according to an embodiment of the present disclosure.

First, FIG. 5 illustrates an operation of transmitting a data read command READ_CMD to the memory device 110 by the memory controller 120 according to an embodiment of the present disclosure.

Referring to FIG. 5, the memory controller 120 may transmit the data read command READ_CMD to the memory device 110 in order to read data stored in the memory device 110. The data read command READ_CMD is a command that the memory controller 120 requests to read data stored in the memory device 110. The memory device 110 may receive the data read command READ_CMD through the data input/output terminal DQ.

FIG. 6 illustrates an operation of outputting data by the memory device 100 after the operation described in FIG. 5 is executed.

Referring to FIG. 6, the memory controller 120 may input a read enable toggle signal N times (i.e., N read enable (RE) toggle signals (N is a natural number) to the memory device 110 in order for the memory device 110 to output data read-requested by the data read command READ_CMD described in FIG. 5.

The memory device 110 may output m-bit data through the data input/output terminals DQ[m-1:0] whenever the read enable toggle signal is input from the memory controller 120. Accordingly, when the N read enable toggle signals are input thereto, the memory device 110 may output (m*N) bits of data through the data input/output terminals DQ[m-1:0].

In this case, the memory device 110 may determine whether the read enable toggle signal is input or not, based on 1) whether a rising edge has occurred in a signal input to the read enable terminal RE, 2) whether a falling edge has occurred in the signal input to the read enable terminal RE, or 3) whether the rising edge and the falling edge continuously occur in the signal input to the read enable terminal RE.

FIG. 7 illustrates an operation in which the memory device 110 outputs status information of the memory device 110 after the operation described in FIG. 6 is executed.

In this case, the status information of the memory device 110 may indicate a status of the memory device 110 after a read operation including the operations described in FIGS. 5 to 6 is executed.

For example, the status information may indicate whether the memory device 110 is in a ready state or a busy state. If the memory device 110 is in the ready state, the memory device 110 may process a command input from the memory controller 120 without limitation. However, in the case that the memory device 110 enters the busy state by executing an internal operation (e.g., an operation of loading read data to a page buffer), the memory device 110 may process only specific types of commands (e.g., a status read command, a reset command, or a random data output command) among commands input from the memory controller 120.

Referring to FIG. 7, the memory controller 120 may input an additional read enable (RE) toggle signal to the memory device 110 after inputting the N read enable (RE) toggle signals to the memory device 110 in order to read data from the memory device 110.

In this case, the memory controller 120 may continuously input the additional read enable toggle signal to the memory device 110 after inputting the N read enable toggle signals to the memory device 110. Alternatively, the memory controller 120 may input the additional read enable toggle signal to the memory device 110 after a preset waiting time elapses from a time point when the N read enable toggle signals are input to the memory device 110.

When the additional read enable toggle signal is input to the memory device 110, the memory device 110 may output the status information of the memory device 110 to the memory controller 120 through the data input/output terminals DQ[m-1:0] in response to the additional read enable toggle signal.

That is, although the memory controller 120 does not separately input a status read command to the memory device 110 after the memory device 110 outputs the read data to the memory controller 120, the memory device 110 may output the status information to the memory controller 120 when the additional read enable toggle signal is input thereto. Accordingly, the memory controller 120 may remove the overhead occurred by transmitting a separate status read command to acquire the status information of the memory device 110, and thus it is possible to reduce a time required to check the status of the memory device 110 after executing the read operation.

In this case, there is no limitation on the number of times the memory controller 120 inputs the additional read enable toggle signal to the memory device 110. That is, the memory controller 120 may input the additional read enable toggle signal to the memory device 110 only once or twice or more. In the case that the memory controller 120 inputs the additional read enable toggle signal to the memory device 110 two or more times, the memory device 110 may output the status information of the memory device 110 whenever the additional read enable toggle signal is input thereto.

Meanwhile, when the memory controller 120 inputs the additional read enable toggle signal to the memory device 110 after the preset waiting time elapses from the time point when an input operation of the N read enable toggle signals to the memory device 110 is ended, the memory controller 120 may check the status of the memory device 110 based on the status information of the memory device 110 that is output to the memory controller 120 through the data input/output terminals DQ[m-1:0]. This is because there is a possibility that the status information of the memory device 110 may be abnormally output in the case of receiving the additional read enable toggle signal from the memory controller 120 before the memory device 110 enters a state capable of normally outputting the status information of the memory device 110.

Meanwhile, the memory device 110 may receive from the memory controller 120 an instruction on whether to execute the operation described in FIGS. 5 to 7. For example, in the case that the memory controller 120 instructs the memory device 110 to execute the operation described in FIGS. 5 to 7, the memory device 110 may output the status information of the memory device 110 when the additional read enable toggle signal is input thereto even if the memory controller 120 does not separately transmit the status read command to the memory device 110.

However, in the case that the memory controller 120 instructs the memory device 110 not to execute the operation described in FIGS. 5 to 7, the memory controller 120 may not input the additional read enable toggle signal, but transmit a separate status read command to the memory device 110 in order to check the status of the memory device 110. The memory controller 120 may instruct the memory device 110 to execute or not to execute the operation described in FIGS. 5 to 7 using a separate command, signal, or feature.

For example, the memory controller 120 may set a feature for instructing the memory device 110 to output the status information of the memory device 110 when the memory controller 120 inputs the additional read enable toggle signal to the memory device 110. In this case, the memory device 110 may output the status information of the memory device 110 when the additional read enable toggle signal is input thereto after the memory controller 120 inputs the N read enable toggle signals to the memory device 110.

On the other hand, the memory controller 120 may reset the feature for instructing the memory device 110 to output the status information of the memory device 110 when the memory controller 120 inputs the additional read enable toggle signal to the memory device 110. In this case, the memory device 110 may output the status information of the memory device 110 when the status read command is input from the memory controller 120 after the memory controller 120 inputs the N read enable toggle signals to the memory device 110.

Hereinafter, it will be described a specific example of an operation performed internally by the memory device 110 to output the status information of the memory device 110 when the additional read enable toggle signal is input thereto.

Figure 8:
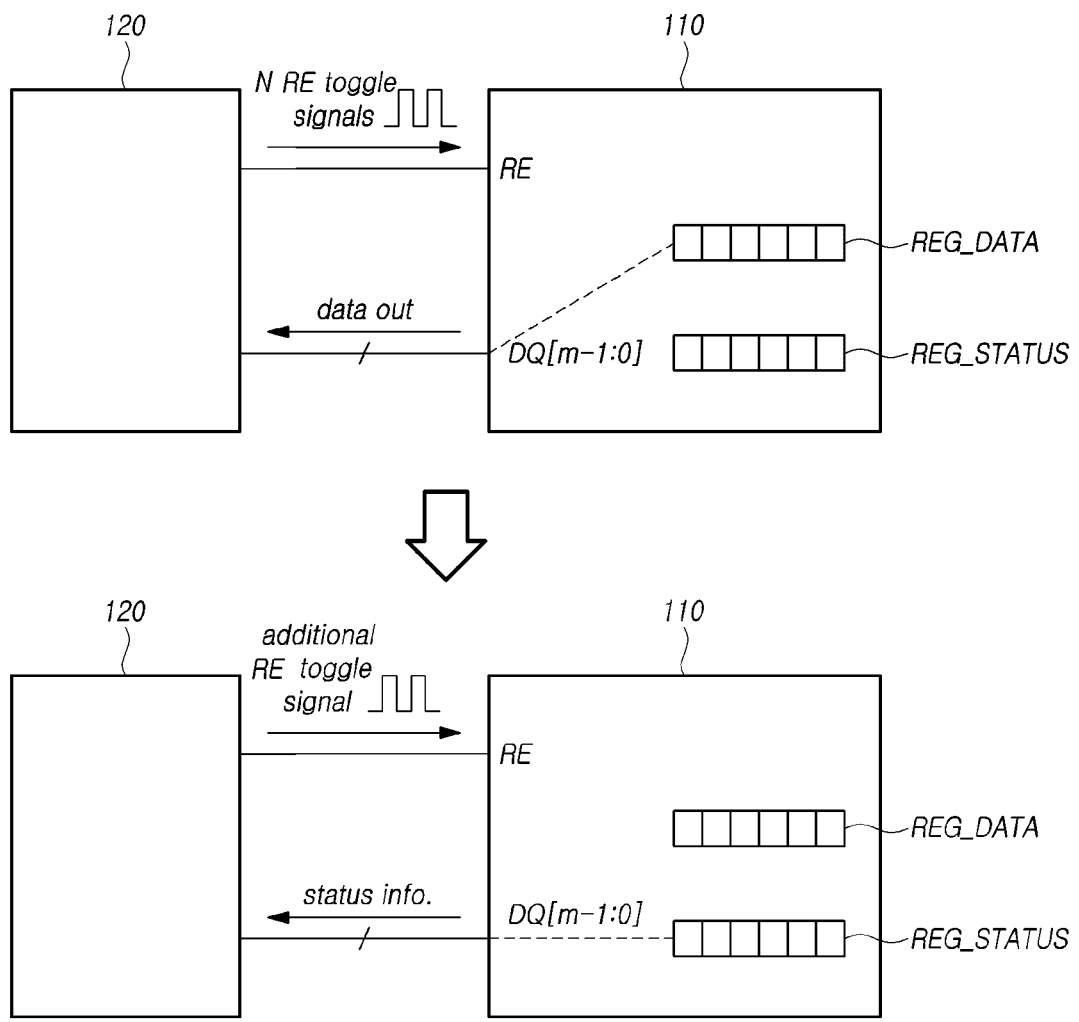
FIG. 8 illustrates an operation of switching a register providing data to a data input/output terminal by a memory device according to an embodiment of the present disclosure.

FIG. 8 illustrates an operation of switching an activated register providing data to the data input/output terminals DQ[m-1:0] by the memory device 110 according to an embodiment of the present disclosure.

In FIG. 8, the memory device 110 may include a data register REG_DATA and a status register REG_STATUS. The data register REG_DATA stores read data requested to be read by the memory controller 120, and the status register REG_STATUS stores the status information of the memory device 110.

The memory device 110 may set the data register REG_DATA or the status register REG_STATUS to be the activated register providing data to the data input/output terminals DQ[m-1:0] so as to determine a type of data output through the data input/output terminals DQ[m-1:0]. The activated register may provide data to the data input/output terminals DQ[m-1:0].

When the N read enable toggle signals are input thereto from the memory controller 120, the memory device 110 may output the read data requested by the memory controller 120 through the data input/output terminals DQ[m-1:0]. In this case, the memory device 110 may set the data register REG_DATA to be the activated register in order to output the read data to the data input/output terminals DQ[m-1:0].

Thereafter, when the additional read enable toggle signal is input thereto from the memory controller 120, the memory device 110 may output the status information of the memory device 110 through the data input/output terminals DQ[m-1:0]. In order to enable the status information of the memory device 110 to be output to the data input/output terminals DQ[m-1:0] after the N read enable toggle signals are input thereto, the memory device 110 may switch the activated register from the data register REG_DATA to the status register REG_STATUS before or after the additional read enable toggle signal is input thereto, even if a separate switching request is not received from the memory controller 120. Accordingly, the memory device 110 may automatically output the status information of the memory device 110 through the data input/output terminals DQ[m-1:0] even if the separate status read command is not received from the memory controller 120.

Figure 9:
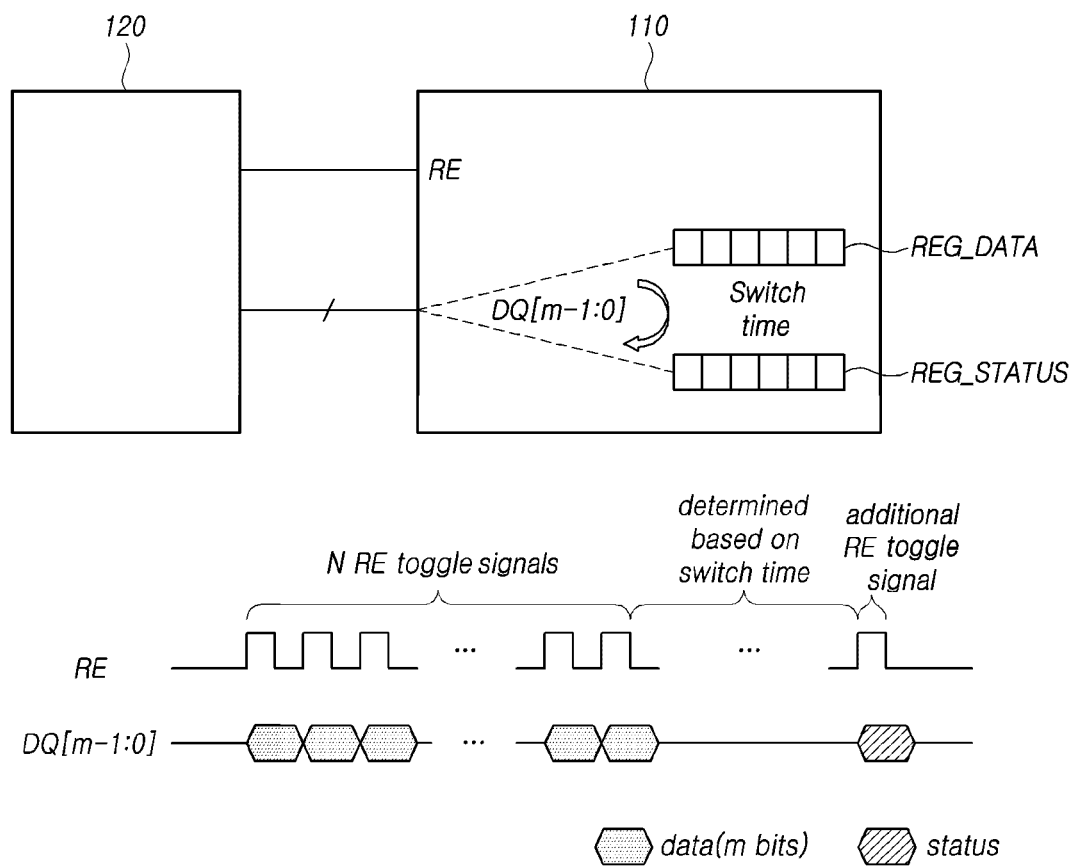
FIG. 9 illustrates an operation of determining a time point for inputting an additional read enable toggle signal based on the operation described in FIG. 8 according to an embodiment of the present disclosure.

FIG. 9 illustrates an operation of determining a time point for inputting the additional read enable toggle signal based on the operation described in FIG. 8.

Referring to FIG. 9, the memory controller 120 may determine the preset waiting time, which is a time period from inputting the N read enable toggle signals to inputting the additional read enable toggle signal, based on a time required for the memory device 110 to switch the activated register from the data register REG_DATA to the status register REG_STATUS.

If the additional read enable toggle signal is input to the memory device 110 before the memory device 110 switches the activated register from the data register REG_DATA to the status register REG_STATUS, the memory controller 120 may erroneously determine data stored in the data register REG_DATA as the status information of the memory device 110. Therefore, in order to prevent such a problem, the memory controller 120 is required to input the additional read enable toggle signal to the memory device 110 after the memory device 110 switches the activated register from the data register REG_DATA to the status register REG_STATUS. To this end, the memory controller 120 may determine the above-mentioned waiting time based on the time required for the memory device 110 to switch the activated register from the data register REG_DATA to the status register REG_STATUS.

Meanwhile, in order for the memory device 110 to correctly output the status information of the memory device 110 to the memory controller 120 as described above, the memory device 110 is required to recognize a time point when the additional read enable toggle signal is input thereto. This is because, if the memory device 110 outputs the status information of the memory device 110 to the data input/output terminals DQ[m-1:0] while the memory controller 120 outputs the N read enable toggle signals for reading data, the memory controller 120 may erroneously determine the status information of the memory device 110 as the read data.

Therefore, the memory device 110 is required to receive information on an N value indicating how many times the memory controller 120 outputs the read enable toggle signal to the memory device 110 before the additional read enable toggle signal is input to the memory device 110.

Hereinafter, it will be described an operation in which the memory device 110 receives the information on the N value from the memory controller 120.

Figure 10:
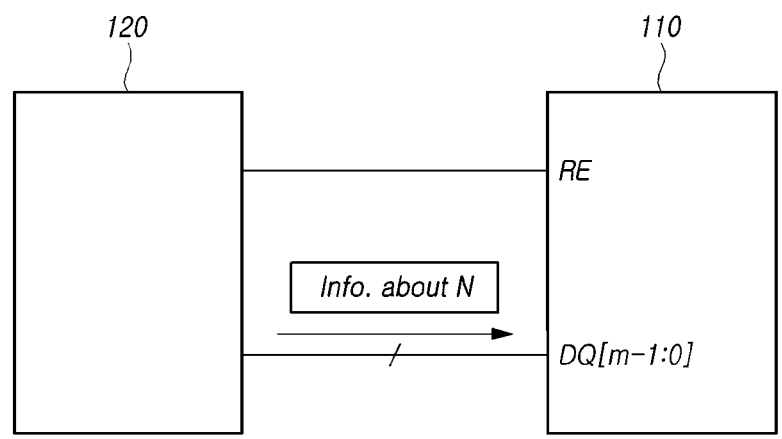
FIG. 10 illustrates a time point when a memory controller transmits information on an N value to a memory device according to an embodiment of the present disclosure.
Figure 10:
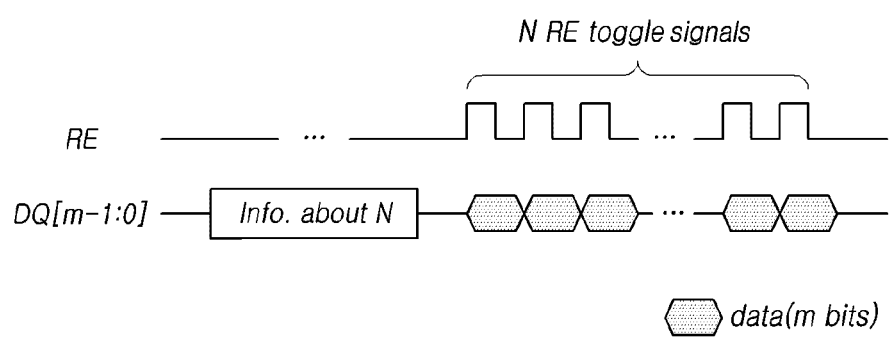
Figure 11:
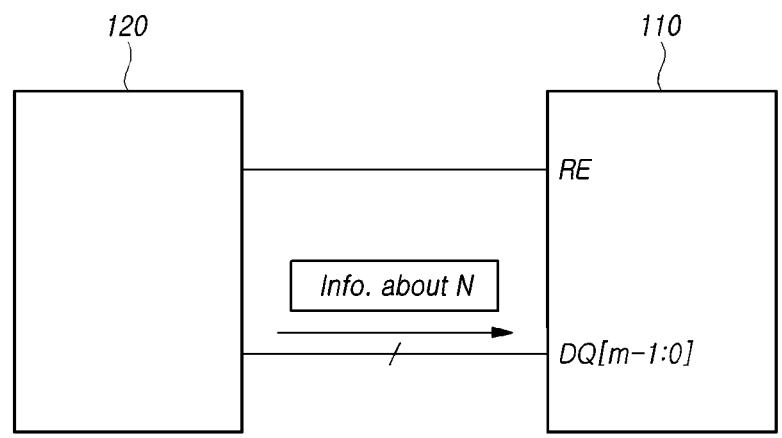
FIG. 11 illustrates a method of transmitting information on an N value to a memory device by a memory controller according to an embodiment of the present disclosure.
Figure 11:
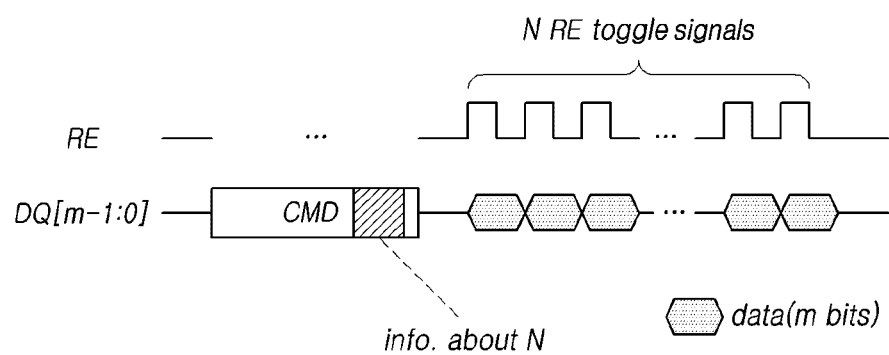
Figure 12:
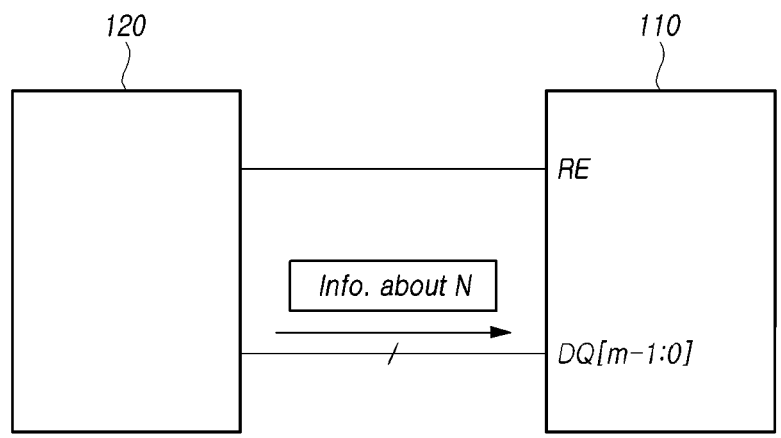
FIG. 12 illustrates a method of transmitting information on an N value to a memory device by a memory controller according to another embodiment of the present disclosure.
Figure 12:
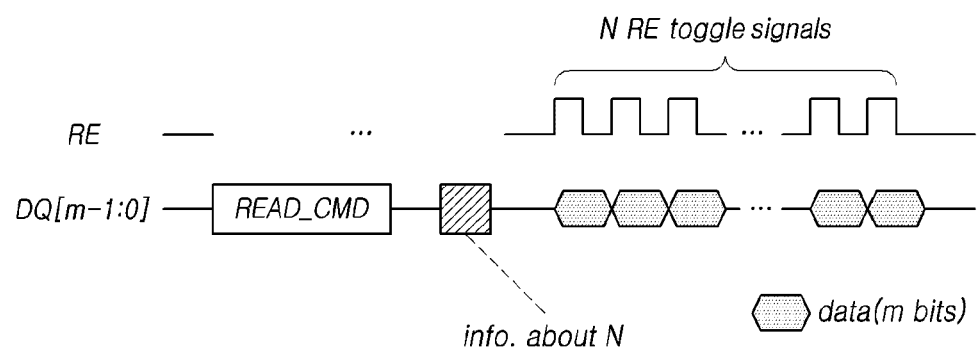

FIGS. 10 to 12 illustrate an operation in which the memory controller 120 provides the information on the N value to the memory device 110 according to an embodiment of the present disclosure.

First, FIG. 10 describes a time point when the memory controller 120 transmits the information on the N value to the memory device 110 according to an embodiment of the present disclosure.

Referring to FIG. 10, the memory controller 120 may transmit the information on the N value to the memory device 110 before inputting the N read enable toggle signals to the memory device 110. This is because the information on the N value is required to be input to the memory device 110 before the N read enable toggle signals so that the memory device 110 recognizes a time point when the operation for inputting the N read enable toggle signals terminates.

FIG. 11 illustrates a method of transmitting the information on the N value to the memory device 110 by the memory controller 120 according to an embodiment of the present disclosure.

Referring to FIG. 11, the memory controller 120 may transmit the information on the N value to the memory device 110 using a command CMD including the information on the N value. In this case, the command CMD including the information on the N value may be a command defined separately from the data read command READ_CMD described in FIG. 5.

For example, the command CMD including the information on the N value may be a command for requesting to read data of a specific size (e.g., 4 KB) to the memory device 110 and indicating that the N value is 2K.

As another example, the command CMD including the information on the N value may only notify the memory device 110 of the size of the N value (e.g., 2K).

FIG. 12 illustrates a method of transmitting the information on the N value to the memory device 110 by the memory controller 120 according to another embodiment of the present disclosure.

Referring to FIG. 12, when transmitting the data read command READ_CMD to the memory device 110, the memory controller 120 may transmit the information on the N value to the memory device 110 together with the data read command READ_CMD. In this case, after transmitting the data read command READ_CMD to the memory device 110, the memory controller 120 may continuously transmit the information on the N value to the memory device 110.

As described above, the memory controller 120 may determine the status of the memory device 110 based on the status information of the memory device 110. For example, the memory controller 120 may determine whether the memory device 110 is in the ready state or the busy state.

Hereinafter, it will be described an operation performed when the memory controller 120 determines that the memory device 110 is in the busy state.

Figure 13:
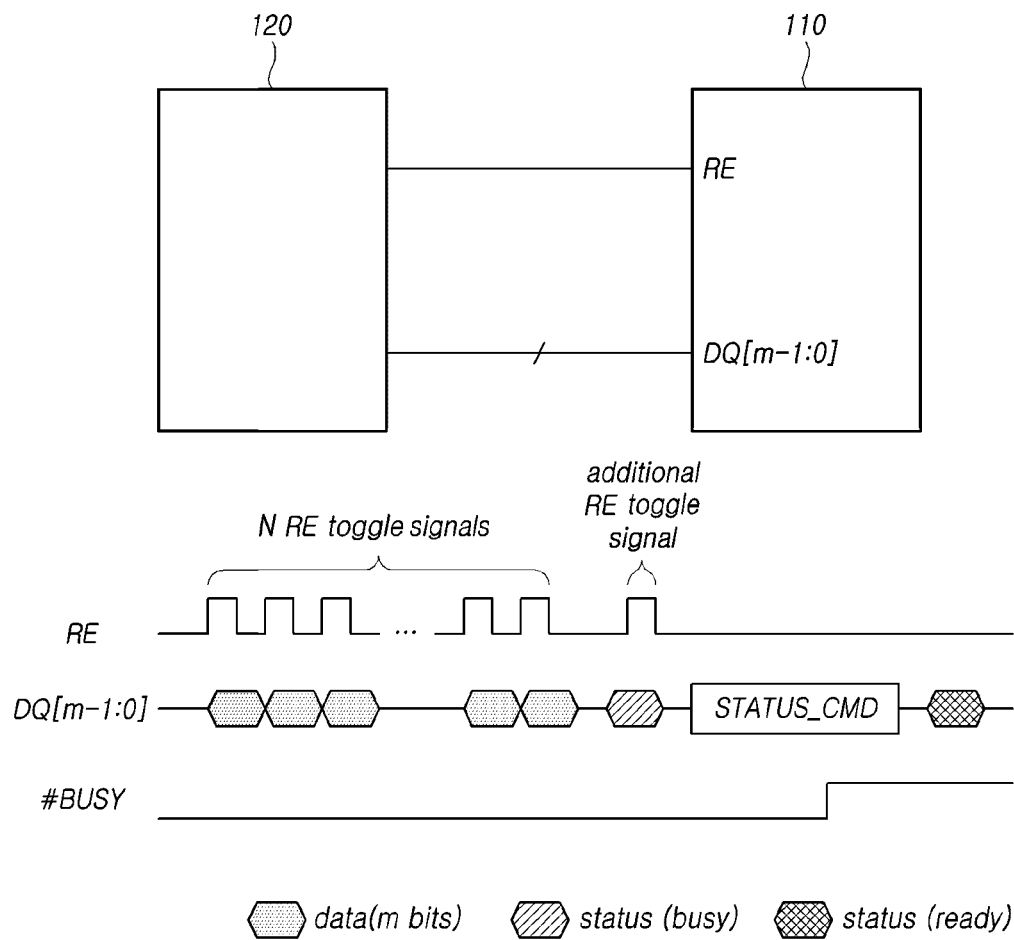
FIG. 13 illustrates an operation performed when a memory controller determines that a memory device is in a busy state according to an embodiment of the present disclosure.
Figure 14:
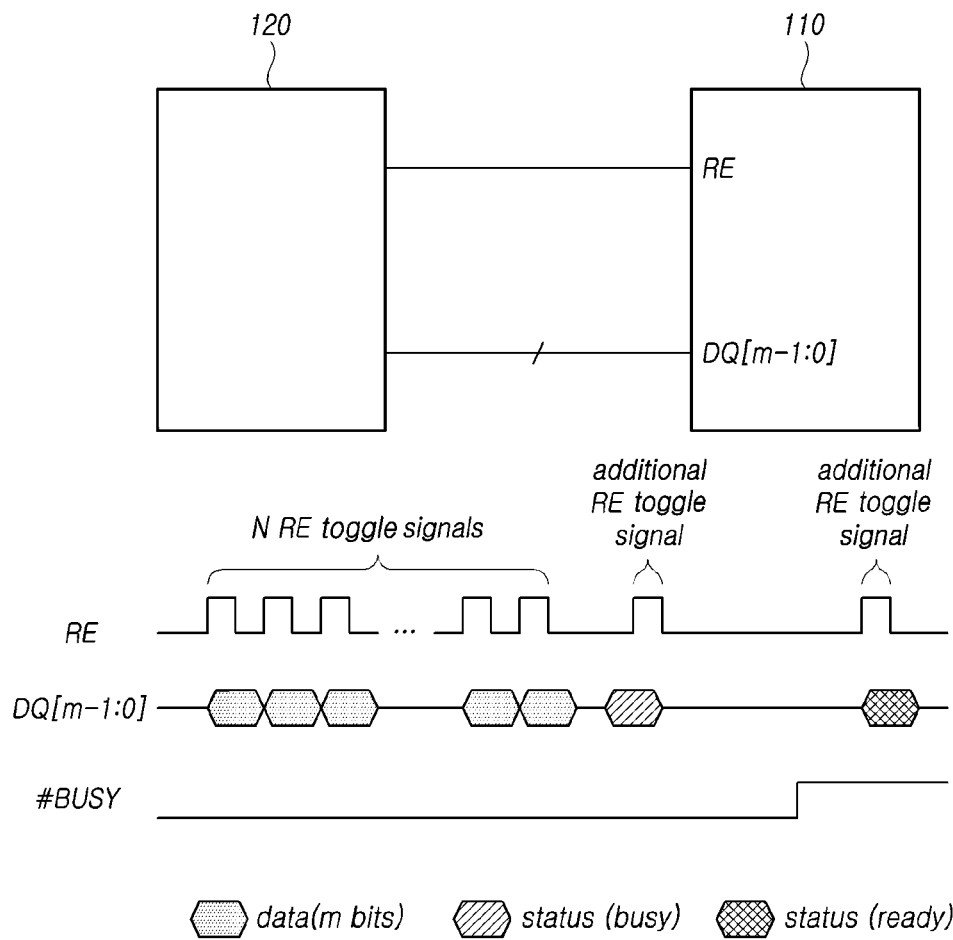
FIG. 14 illustrates an operation performed when a memory controller determines that a memory device is in a busy state according to another embodiment of the present disclosure.

Referring to FIGS. 13 and 14, the memory device 110 may manage a busy flag #BUSY indicating whether the memory device 110 is in the busy state or the ready state. For example, when the memory device 110 is in the busy state, the busy flag #BUSY may have a logic low level, and when the memory device 110 is in the ready state, the busy flag #BUSY may have a logic high level.

FIG. 13 illustrates an operation performed when the memory controller 120 determines that the memory device 110 is in the busy state according to an embodiment of the present disclosure.

Referring to FIG. 13, the memory controller 120 may input the additional read enable toggle signal to the memory device 110 after inputting the N read enable toggle signals to the memory device 110. If the memory device 110 is still in the busy state when the additional read enable toggle signal is input to the memory device 110, the status information indicating that the memory device 110 is in the busy state may be output to the memory controller 120 through the data input/output terminals DQ[m-1:0].

After that, the memory controller 120 may additionally transmit a status read command STATUS_CMD to the memory device 110 in order to check whether the status of the memory device 110 has been changed from the busy state to the ready state. When the memory device 110 determines that the status of the memory device 110 has been changed from the busy state to the ready state in response to the status read command STATUS_CMD, the memory device 110 may output the status information indicating that the memory device 110 is in the ready state to the memory controller 120.

FIG. 14 illustrates an operation performed when the memory controller 120 determines that the memory device 110 is in the busy state according to another embodiment of the present disclosure.

Referring to FIG. 14, similar to the operation described in FIG. 13, the memory controller 120 inputs the additional read enable toggle signal to the memory device 110 after inputting the N read enable toggle signals to the memory device 110. When the additional read enable toggle signal is input thereto, the memory device 110 may output the status information indicating that the memory device 110 is in the busy state since the memory device 110 is still in the busy state.

After that, the memory controller 120 may additionally input another additional read enable toggle signal to the memory device 110 in order to check whether the status of the memory device 110 has been changed from the busy state to the ready state. Here, when the memory device 110 determine that the status of the memory device 110 has been changed from the busy state to the ready state, the memory device 110 may output the status information indicating that the memory device 110 is in the ready state to the memory controller 120.

Figure 15:
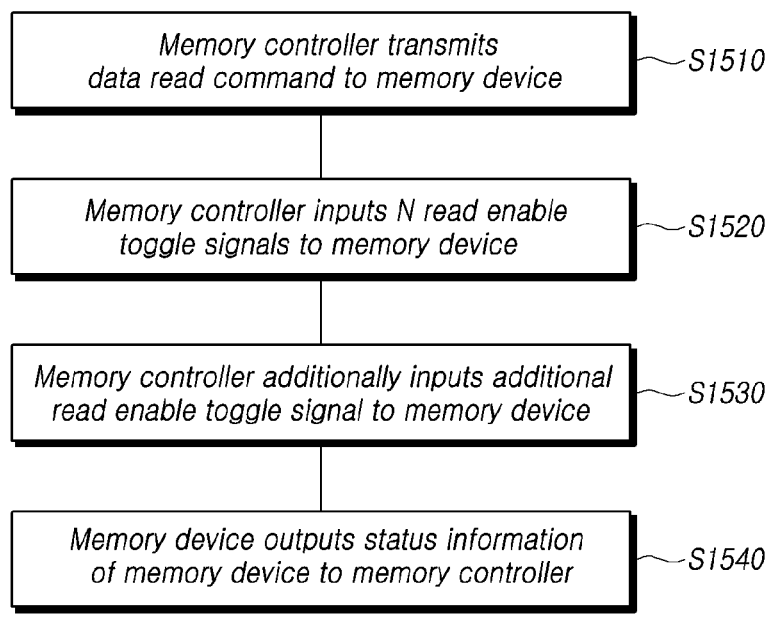
FIG. 15 illustrates a method of operating a memory system according to an embodiment of the present disclosure.

FIG. 15 illustrates an operating method of the memory system 100 of FIG. 1 according to an embodiment of the present disclosure. The operating method illustrated in FIG. 15 will be described with reference to FIG. 1.

Referring to FIG. 15, at S1510, the memory controller 120 transmits a data read command READ_CMD to the memory device 110 in order to read data stored in the memory device 110.

At S1520, the memory controller 120 inputs N read enable toggle signals to the memory device 110 in order for the memory device 110 to output the data read-requested by the data read command READ_CMD.

Meanwhile, the memory controller 120 may further input the information on the N value to the memory device 110 before inputting the N read enable toggle signals to the memory device 110.

In an embodiment, the information on the N value may be transmitted to the memory device 110 through a command including the information on the N value. In another embodiment, the information on the N value may be transmitted to the memory device 110 together with the data read command READ_CMD.

At S1530, the memory controller 120 may input an additional read enable toggle signal to the memory device 110.

At S1540, the memory device 110 may output status information of the memory device 110 to the memory controller 120 when the additional read enable toggle signal is input thereto.

Meanwhile, the memory controller 120 may check a status of the memory device 110 based on the status information that is output after a preset waiting time elapses from a time point when an input operation of the N read enable toggle signals to the memory device 110 is ended.

After the N read enable toggle signals are input to the memory device 110, an activated register providing data to a data input/output terminal DQ may be switched from a data register REG_DATA storing the data read-requested by the data read command READ_CMD to a status register REG_STATUS storing the status information. In this case, the preset waiting time, which is a time period from inputting the N read enable toggle signals to inputting the additional read enable toggle signal, may be determined based on a time required for the memory device 110 to switch the activated register from the data register REG_DATA to the status register REG_STATUS.

Meanwhile, when the status information output from the memory device 110 at S1540 indicates that the memory device 110 is in a busy state, the operating method of the memory system 100 may further include transmitting, by the memory controller 120, a status read command or another additional read enable toggle signal to the memory device 110.

Figure 16:
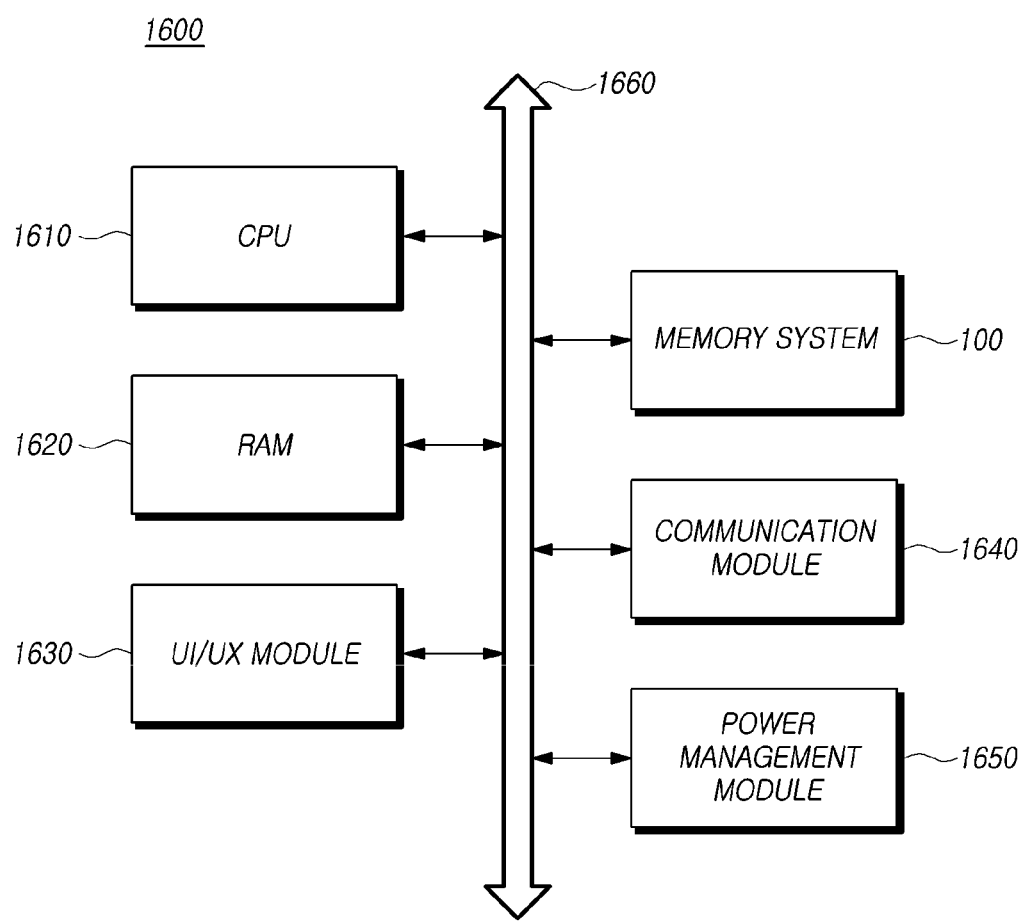
FIG. 16 is a diagram illustrating the configuration of a computing system based on some embodiments of the disclosed technology.

FIG. 16 is a diagram illustrating the configuration of a computing system 1600 based on an embodiment of the disclosed technology.

Referring to FIG. 16, the computing system 1600 based on an embodiment of the disclosed technology may include: a memory system 100 electrically connected to a system bus 1660; a CPU 1610 configured to control the overall operation of the computing system 1600; a RAM 1620 configured to store data and information related to operations of the computing system 1600; a user interface/user experience (UI/UX) module 1630 configured to provide the user with a user environment; a communication module 1640 configured to communicate with an external device as a wired and/or wireless type; and a power management module 1650 configured to manage power used by the computing system 1600.

The computing system 1600 may be a personal computer (PC) or may include a mobile terminal such as a smartphone, a tablet or various electronic devices.

The computing system 1600 may further include a battery for supplying an operating voltage, and may further include an application chipset, a graphic-related module, a camera image processor, and a DRAM. Other elements would be obvious to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

Based on embodiments of the disclosed technology described above, the operation delay time of the memory system may be advantageously reduced or minimized. In addition, based on an embodiment of the disclosed technology, an overhead occurring in the process of calling a specific function may be advantageously reduced or minimized. Although various embodiments of the disclosed technology have been described with particular specifics and varying details for illustrative purposes, those skilled in the art will appreciate that various modifications, additions and substitutions may be made based on what is disclosed or illustrated in this patent document.

What is claimed is:

1. A memory system, comprising:
   a memory device configured to store data; and
   a memory controller configured to communicate with the memory device and control the memory device,
   wherein the memory controller is configured to:
   transmit a data read command to the memory device in order to read data stored in the memory device;
   input N read enable toggle signals (N is a natural number greater than or equal to 2) to the memory device in order for the memory device to output the data requested by the data read command; and
   input an additional read enable toggle signal to the memory device, after the N read enable toggle signals are inputted to the memory device and the data requested by the data read command is outputted from the memory device to the memory controller, and
   wherein the memory device is configured to output status information of the memory device to the memory controller in response to the additional read enable toggle signal input from the memory controller.

2. The memory system of claim 1, wherein, after a preset waiting time elapses from a time point when an input operation of the N read enable toggle signals to the memory device is ended, the memory controller checks a status of the memory device based on the status information of the memory device output from the memory device.

3. The memory system of claim 1, wherein the memory device includes a data register storing the data requested by the data read command and a status register storing the status information of the memory device, and
   wherein, after receiving the N read enable toggle signals, the memory device switches an activated register for outputting data to the memory controller from the data register to the status register.

4. The memory system of claim 3, wherein the memory controller determines a preset waiting time, which is a time period from inputting the N read enable toggle signals to inputting the additional read enable toggle signal, based on a time required for the memory device to switch the activated register from the data register to the status register.

5. The memory system of claim 1, wherein the memory controller transmits information on an N value to the memory device before inputting the N read enable toggle signals to the memory device.

6. The memory system of claim 5, wherein the memory controller transmits the information on the N value to the memory device using a command that is different from the data read command.

7. The memory system of claim 5, wherein the memory controller transmits the information on the N value together with the data read command to the memory device.

8. The memory system of claim 1, wherein, when the status information output from the memory device in response to the additional read enable toggle signal indicates that the memory device is in a busy state, the memory controller transmits a status read command or another additional read enable toggle signal to the memory device.

9. An operating method of a memory system including a memory device to store data and a memory controller to control the memory device, the method comprising:
   transmitting, by the memory controller, a data read command to the memory device in order to read data stored in the memory device;
   inputting, by the memory controller, N read enable toggle signals (N is a natural number greater than or equal to 2) to the memory device in order for the memory device to output the data requested by the data read command;
   inputting, by the memory controller, an additional read enable toggle signal to the memory device, after the N read enable toggle signals are inputted to the memory device and the data requested by the data read command is outputted from the memory device to the memory controller; and
   outputting, by the memory device, status information of the memory device to the memory controller in response to the additional read enable toggle signal input from the memory controller.

10. The operating method of claim 9, further comprising checking, by the memory controller, a status of the memory device based on the status information of the memory device output from the memory device, after a preset waiting time elapses from a time point when an input operation of the N read enable toggle signals to the memory device is ended.

11. The operating method of claim 9, wherein the memory device includes a data register storing the data requested by the data read command and a status register storing the status information of the memory device, and, after the N read enable toggle signals are input to the memory device, an activated register for outputting data to the memory controller is switched from the data register to the status register.

12. The operating method of claim 11, wherein, a preset waiting time, which is a time period from inputting the N read enable toggle signals to inputting the additional read enable toggle signal, is determined based on a time required for the memory device to switch the activated register from the data register to the status register.

13. The operating method of claim 9, further comprising transmitting, by the memory controller, information on an N value to the memory device before inputting the N read enable toggle signals to the memory device.

14. The operating method of claim 13, wherein the information on the N value is transmitted to the memory device using a command that is different from the data read command.

15. The operating method of claim 13, wherein the information on the N value is transmitted to the memory device together with the data read command.

16. The operating method of claim 9, further comprising, when the status information output from the memory device in response to the additional read enable toggle signal indicates that the memory device is in a busy state, transmitting, by the memory controller, a status read command or another additional read enable toggle signal to the memory device.

17. A memory device, comprising:
- a data register storing data requested by a data read command;
- a status register storing status information of the memory device; and
- a control logic controlling an operation of the memory device; and
- wherein the control logic is configured to:
- receive the data read command from a memory controller in order to read the data stored in the memory device;
- receive N read enable toggle signals (N is a natural number greater than or equal to 2) from the memory controller to output the data requested by the data read command;
- receive an additional read enable toggle signal from the memory controller, after the N read enable toggle signals are inputted from the memory controller and the data requested by the data read command is outputted to the memory controller;
- output the status information of the memory device to the memory controller in response to the additional read enable toggle signal inputted from the memory controller; and
- switch an activated register for outputting the data to the memory controller from the data register to the status register after receiving the N read enable toggle signals.

* * * * *